United States Patent [19]

Dao

[11] 3,950,636
[45] Apr. 13, 1976

[54] HIGH SPEED MULTIPLIER LOGIC CIRCUIT

[75] Inventor: Tich T. Dao, Cupertino, Calif.

[73] Assignee: Signetics Corporation, Sunnyvale, Calif.

[22] Filed: Jan. 16, 1974

[21] Appl. No.: 433,871

[52] U.S. Cl. .............................................. 235/164
[51] Int. Cl.$^2$ ........................................ G06F 7/38
[58] Field of Search .................................. 235/164

[56] References Cited
UNITED STATES PATENTS

| | | | |
|---|---|---|---|
| 3,278,732 | 10/1966 | Haynes | 235/164 |
| 3,407,290 | 10/1968 | Atrubin | 235/164 |
| 3,524,977 | 8/1970 | Wang | 235/164 |
| 3,691,359 | 9/1972 | Dell et al. | 235/164 |
| 3,720,821 | 3/1973 | Heightley | 235/164 |
| 3,752,971 | 8/1973 | Calhoun et al. | 235/164 |
| 3,761,698 | 9/1973 | Stephenson | 235/164 |
| 3,878,985 | 4/1975 | Ghest et al. | 235/164 |

OTHER PUBLICATIONS

Wallace; "A Suggestion for a Fast Multiplier", IEEE Transactions on Electronic Computers; Feb. 1964, pp. 14–17.

Larson; "High-Speed Multiply Using Four Input Carry-Save Adder", IBM Technical Disclosure Bulletin; Vol. 16, No. 7, Dec. 1973, pp. 2053–2054.

Singh et al.; "Partial Product Array for High-Speed Multiply Using Adders for Multiple Additions;" IBM Technical Disclosure Bulletin; Vol. 14, No. 1, June 1971; pp. 287–289.

Primary Examiner—Charles E. Atkinson
Assistant Examiner—Errol A. Krass
Attorney, Agent, or Firm—C. Richard Pfeiffer; William H. Dana

[57] ABSTRACT

A 4 × 4 multiplier uses four bit threshold logic type adders. The multiplier per se is arranged in a carry save configuration with first level pseudo type carry-look ahead with the highest weight bit of the product being accomplished by a wired OR connection. The four bit adder itself provides two double threshold detectors responsive to logic levels provided by a level shifter which shifts the logical voltage levels produced by a differential amplifier which sums the four inputs of the adder circuit. This provides the sum output; an additional double threshold detector provides the first carry output and a typical threshold AND gate the second carry output.

6 Claims, 9 Drawing Figures

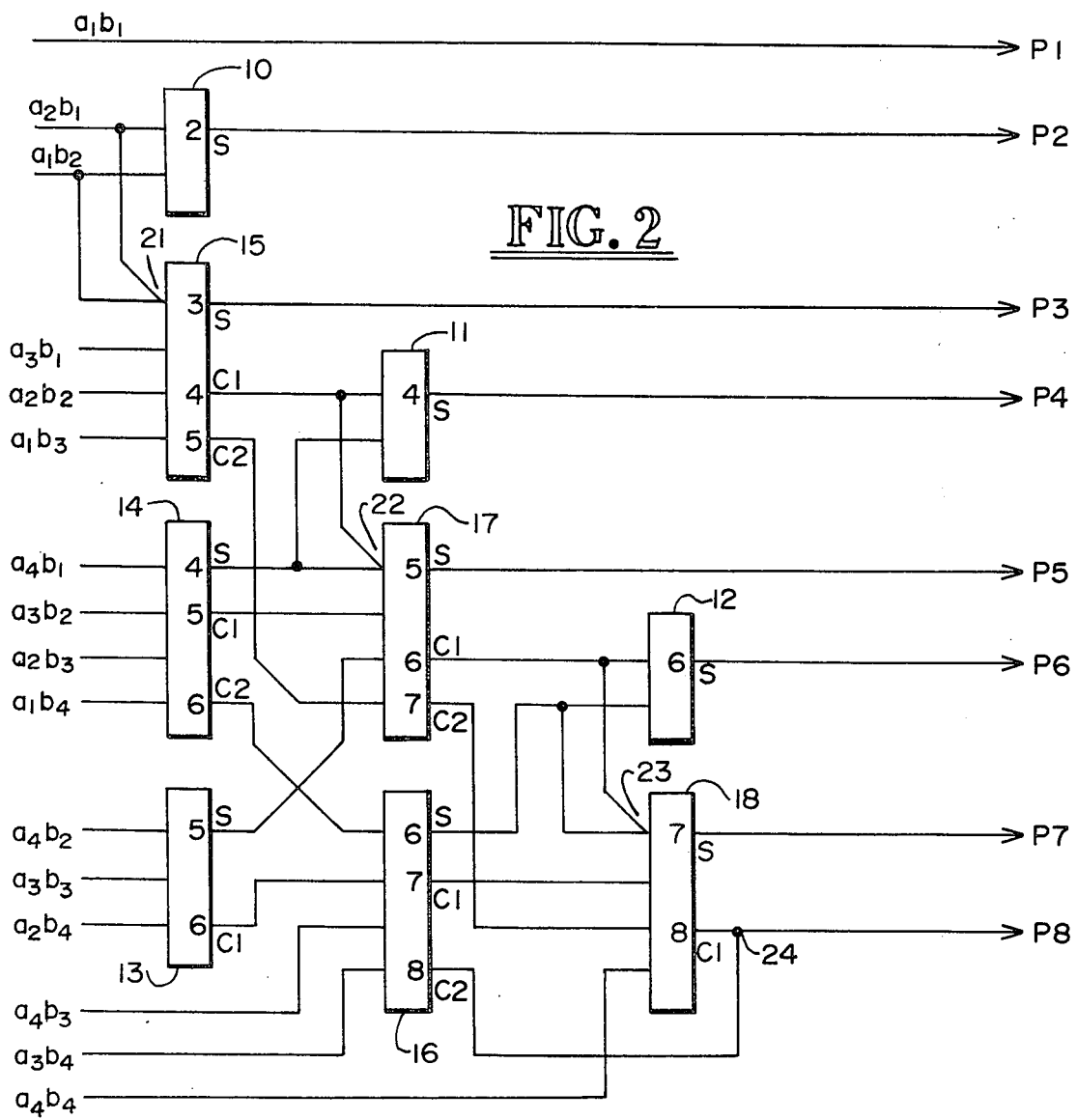

| X+Y+Z+W = ≤ | S | C1 | C2 |
|---|---|---|---|
| 0 | 0 | 0 | 0 |
| 1 | 1 | 0 | 0 |
| 2 | 0 | 1 | 0 |
| 3 | 1 | 1 | 0 |
| 4 | 0 | 0 | 1 |
FIG. 3
4 BIT ADDER
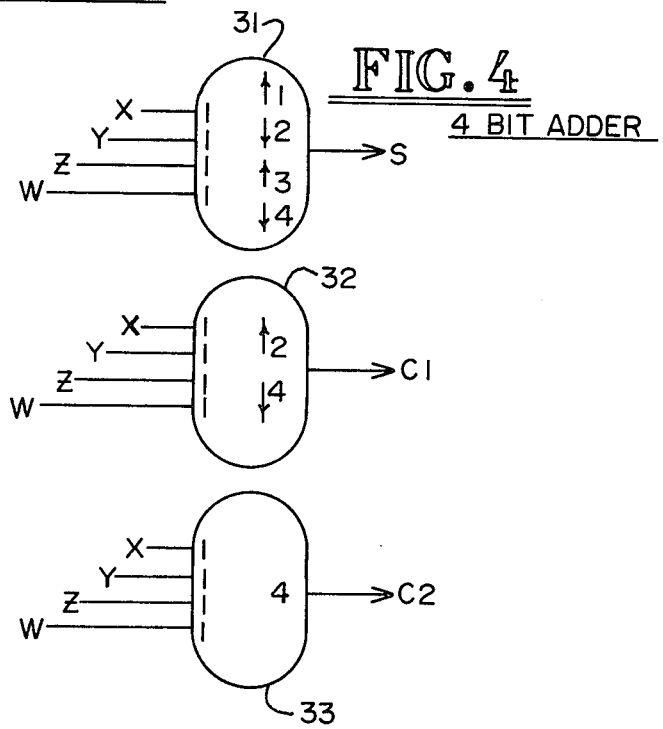
FIG. 4
4 BIT ADDER
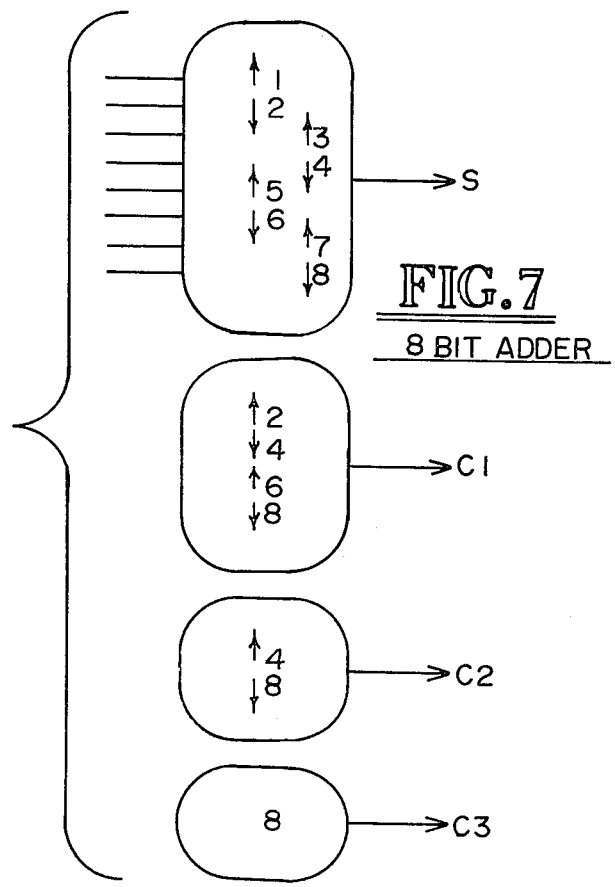
FIG. 7
8 BIT ADDER
| ≤ | S | C1 | C2 | C3 |
|---|---|---|---|---|
| 0 | 0 | 0 | 0 | 0 |
| 1 | 1 | 0 | 0 | 0 |
| 2 | 0 | 1 | 0 | 0 |
| 3 | 1 | 1 | 0 | 0 |
| 4 | 0 | 0 | 1 | 0 |
| 5 | 1 | 0 | 1 | 0 |
| 6 | 0 | 1 | 1 | 0 |
| 7 | 1 | 1 | 1 | 0 |
| 8 | 0 | 0 | 0 | 1 |
FIG. 6
8 BIT ADDER

HIGH SPEED MULTIPLIER LOGIC CIRCUIT

BACKGROUND OF THE INVENTION

The present invention is directed to a high speed multiplier logic circuit and more particularly to a 4 × 4 multiplier using 4 bit threshold logic type adders.

Almost all parallel multipliers are designed around adders which are arranged to minimize the number of addition levels required and thereby optimize operation delay. A further improvement is achieved by the use of carry-look ahead circuits. However, with larger size multipliers such as 4 × 4 or 8 × 8 the operation delay is excessive.

OBJECT AND SUMMARY OF THE INVENTION

It is, therefore, an object of the present invention to provide a high speed multiplier logic circuit which has reduced operation delay.

In accordance with the above object there is provided a binary multiplier logic circuit for multiplying two numbers each represented by a group of bits arranged in increasing order in which a product is provided which is obtained by adding all of the partial products of the same weight. The product consists of several bits of increasing weights. A plurality of adder circuits add either partial products and/or sums or carries of a single weight with the adder circuits having as outputs sums (S) of a weight corresponding to the single weight and one or more carries (C1, C2, . . . ) of higher weights. The adder circuits are staged in a carry save configuration. A predetermined plurality of the adder circuits have only an S output for providing bits of the product corresponding to the single weight of the S output and to the inputs to the predetermined adder circuits. Carry-look ahead means sum the inputs of each of the predetermined adder circuits and couple the sum to an adder circuit which provides an S output of the next higher weight relative to the respective predetermined adder circuits.

BRIEF DESCRIPTION OF THE DRAWINGS

FIG. 1 illustrates typical 4 × 4 multiplication;

FIG. 2 is a block diagram of a multiplier logic circuit embodying the present invention;

FIG. 3 is a truth table for a 4 bit adder used in the present invention;

FIG. 4 is a threshold logic diagram of a 4 bit adder as in FIG. 3;

FIG. 6 is a truth table for an 8 bit adder; and

FIG. 7 is a threshold logic diagram of an 8 bit adder as in FIG. 6.

DETAILED DESCRIPTION OF THE PREFERRED EMBODIMENT

Figure 5A:
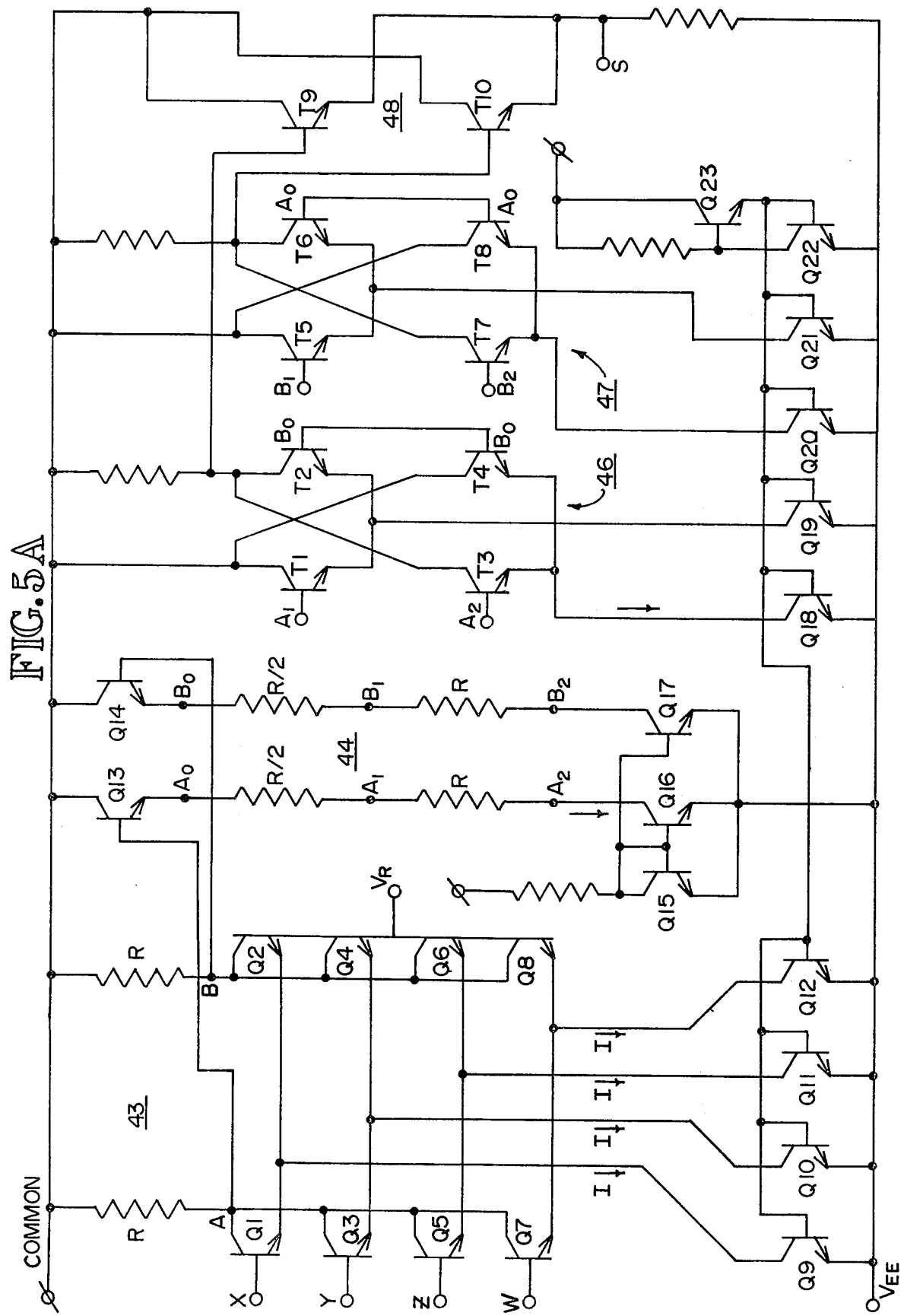
FIGS. 5A and 5B are circuit schematics of FIG. 4.

FIG. 1 is a multiplication table illustrating a typical 4 × 4 multiplication of two numbers A and B with the bits $a_1$ through $a_4$ and $b_1$ through $b_4$ being arranged in increasing order. Their partial products are as illustrated and the sum P of these partial products is 8 bits, $P_1$ through $P_8$ which are obtained by adding all of the bits or partial products of the same weight.

In accordance with the invention, the partial products of FIG. 1 are actually added together in the adder circuit of FIG. 2 which has as its output the 8 bits $P_1$ through $P_8$ and with all of the partial products shown in FIG. 1 as inputs. The partial products would, of course, be obtained by a simple ANDing technique. The blocks are adder circuits with the blocks 10, 11 and 12 being standard two input adders and the block 13 a standard three input adder. The remaining adder circuits 14 through 18 are four input or four bit adder circuits which as will be discussed below preferably are implemented in threshold logic although standard implementation may be suitable in some cases.

All of the adder circuits have in accordance with standard notation a sum output S and in addition, one or two additional carry outputs C1 and C2. The outputs of the adder circuits have been designated with their relative weight, the sum output having the same weight as the common weight of all of the inputs to the particular adder circuit and the carry outputs being the next higher weight or weights, whatever is the case.

The adder circuits of FIG. 2 are staged in a carry save configuration; that is, the carries of any particular summing operation are treated separately. In addition, a first level carry-look ahead is provided which is of a "pseudo" look ahead type. Specifically, the two inputs of the adder block 10 are also coupled to the one of the inputs of adder block 15 as shown at 21 and internally ANDed. The internal or wired AND connection thus in essence provides the summing or ANDing of the two inputs of the unit 10 to indicate whether a carry is necessary. In other words, supposing the two inputs were both of a binary 1 level then when these are added by ANDing the one output would result. In an electrical configuration, of course, the internal connection is like a wired OR gate except that in the ECL logic of the present invention it serves as an AND gate.

Similarly, the same type of carry-look ahead is provided from the inputs of logic unit 11 to 17 and the inputs of logic unit 12 to adder 18 to points specifically 22 and 23, respectively. Thus, the carry-look ahead means sums the inputs of three predetermined adders 10, 11 and 12 these predetermined adder circuits having only an S output as illustrated for providing the binary bits $P_2$, $P_4$ and $P_6$ of the final product, P. Moreover, to accomplish the carry-look ahead, the inputs to the predetermined adder circuits 10, 11 and 12 are coupled to the next higher weight adder circuit; in other words, the adder circuit which provides a sum or S output of the next higher weight.

The highest weight or $P_8$ bit of the final product as illustrated in FIG. 2 is provided by a wired OR summing connection at point 24 which is the C1 carry of block 18 and the C2 carry of block 16. Both of these carries are of weight 8. This can be done by a wired OR technique since it can be shown theoretically referring to FIG. 1 that there cannot be two weight "8" outputs at the same time.

Thus, the multiplier circuit of FIG. 2 performs a product operation in only three additive levels or stages. This is in comparison to the prior art which required at least four stages if constructed with a relatively complicated carry-look ahead configuration, six stages in a DADDA pyramid type array or seven stages in a Guild cellular array.

Moreover by the ANDing technique at points 21, 22 and 23 used for the pseudo carry-look ahead, the four input or four bit adders actually have an effective five inputs.

As stated above, the four input adders of FIG. 2 namely, the blocks 14 through 18 can be implemented in standard exclusive OR logic; for example, see in the IEEE Transactions on Computers, February 1973, No. 2, an article entitled "Multiple Operand Addition and Multiplication" by Singh and Wauman, page 113. However, this is a relatively complex technique since the four input data must conform to the truth table of FIG. 3. However, a four bit adder can be implemented utilizing threshold logic in accordance with copending application Ser. No. 425,217, filed Dec. 17, 1973, in the name of Tich T. Dao, entitled "Threshold Logic Gate" and now U.S. Pat. No. 3,838,393 and assigned to the present assignee. Such implementation is illustrated in FIG. 4. A first threshold device 31 provides the sum output, the second device 32 provides the C1 output and a typical AND gate threshold device 33 provides the C2 output in accordance with the truth table of FIG. 3 and as more fully explained in the above patent.

The basic building blocks 31, 32 and 33 can be compared to the truth table; that is, with one true input the sum output is one; and therefore will have an upward threshold on one with two true inputs the sum is 0 and thus there is a downward threshold on two. Similarly, there is an upward threshold if three inputs are present and a downward threshold with four inputs. With respect to the C1 output of a four bit adder, if two inputs are present there is an upward threshold on two and on four a downward threshold. Lastly, the C2 carry is merely an AND gate since when four true inputs are present an output is produced.

Figure 5B:
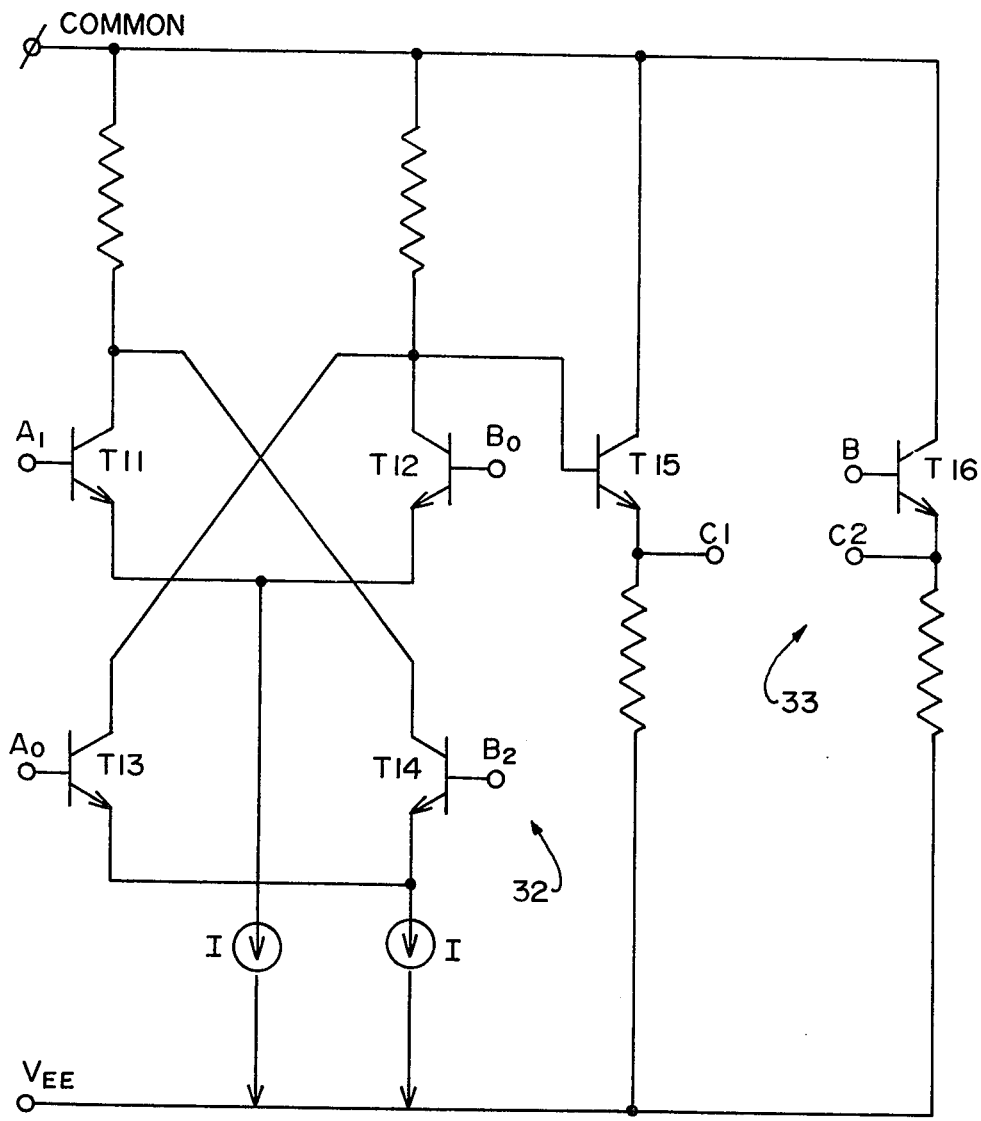

FIGS. 5A and 5B are detailed circuit diagrams of FIG. 4. The four inputs, X, Y, Z and W are connected to a differential switch 43 which serves as a unit current weight driver. It includes four pairs of transistors (Q1, Q2), (Q3, Q4), (Q5, Q6) and (Q7, Q8). Each transistor pair forms a unit current weight driver as indicated in FIG. 4 corresponding to the inputs X, Y, Z and W. The collectors of transistors Q1, Q3, Q5 and Q7 are coupled together at node A and the collectors of Q2, Q4, Q6 and Q8 are coupled together at node B. Both nodes A and B are connected to common through identical resistors R. The bases of transistors Q2, Q4, Q6 and Q8 are connected to a reference voltage $V_R$. Q9, Q10, Q11 and Q12 are current sources each providing a current I and coupled to the respective emitters of the transistors pairs. Thus, the differential switch 43 will cause 4I to flow through the resistor R associated with node A with zero current through the resistor associated with node B or vice versa depending on the number of inputs which are true or in other words, are a binary 1, and the current will be appropriately shared. In other words, the differential switch serves as a logical summing device to provide voltages at nodes A and B which are representative of the number of on or true inputs.

The voltage levels at nodes A and B are coupled to level shifter means generally indicated at 44 which includes transistors Q13 and Q14 having their respective bases coupled to nodes A and B and with their emitters coupled to level shifting resistors designated R/2 and R having their threshold points $A_0$, $A_1$, and $A_2$ in the case of node A and transistor Q13 and $B_0$, $B_1$ and $B_2$ in the case of transistor Q14 and node B. Thus, the level shifter 44 is responsive to the complementary weighted currents through the resistors R of switch 43 which provide corresponding voltage drops at nodes A and B for simultaneously producing a plurality of different threshold levels related to the weighted currents.

Figure 5C:
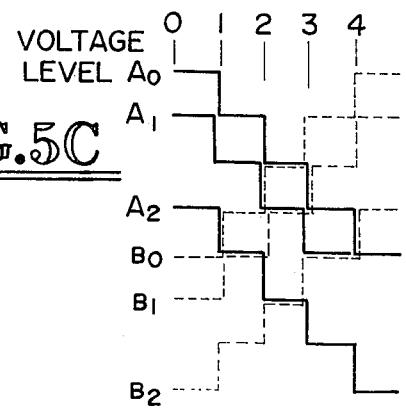
FIG. 5C is a voltage level diagram useful in understanding the circuit of FIGS. 5A and 5B.

Transistors Q15, Q16, and Q17 are coupled as current mirrors to provide for equal currents in transistors Q13 and Q14 in order that the threshold level points will be exactly complementary. These voltage levels are indicated in FIG. 5C by the solid lines for the A levels and the dashed lines for the B levels. It is apparent from the figure that the level step between the one and two subscripts is double that of the step between 0 and 1 subscripts due to the resistor relationships. This provides for unambiguous switching levels as discussed in the above patent.

Still referring to FIG. 5A, two double threshold detectors 46 and 47 are provided. Detector 46 includes transistors T1 through T4 and detector 47, transistors T5 through T8. The transistors are cross-coupled differential amplifiers. Their base input terminals are coupled to the similarly lettered threshold levels of the level shifter 44. A current mirror is provided by transistors Q22 and Q23 and transistors Q18 through Q21 are current sources for the threshold detectors 46 and 47.

An OR gate 48 which consists of transistors T9 and T10 is connected to double threshold detectors 46 and 47 to provide at their emitter terminals the output S.

As thus far described, the circuit of FIG. 5A is equivalent to the threshold logic unit 31 in providing an output S in response to the various threshold levels. Specifically, and referring both to FIG. 5A and FIG. 5C, the up threshold with one true input is at the vertical intersection of the $B_0$ $A_2$ waveforms, a down threshold at the two input point is provided by the $B_0$ $A_1$ threshold levels, an up threshold level at 3 and a down at 4 are provided respectively by the voltage threshold levels $A_0$ $B_2$ and $A_0$ $B_1$. Thus, the S output is almost identical to an output as discussed in the above patent for providing a four bit parity checker.

FIG. 5B is a continuation of FIG. 5A in that the same common and $V_{ee}$ lines are utilized and provide referring to FIGS. 3 and 4 the C1 and C2 outputs of the four bit adder. The circuit of FIG. 5B is again a cross-coupled differential amplifier consisting of transistors T11 through T14 where with the base inputs of the transistors being coupled to the voltage levels as indicated. Referring to the voltage level diagram of FIG. 5C, the $A_1$ $B_0$ threshold levels will provide an up threshold at the two level and the $A_0$ $B_2$ levels a down threshold at the four input level in accordance with threshold unit 32 of FIG. 4 and the truth table of FIG. 3. An output transistor T15 with its base coupled to collector T12 provides the carry output. C1. The last carry output C2 which is merely an AND gate function as illustrated in FIG. 4 by threshold unit 33 is provided by coupling the base input of transistor T16 to the "B" point of FIG. 5A which is near the collector of transistor Q2.

In summary, a four bit adder is, therefore, provided in threshold logic which conforms to the truth table of FIG. 3 and having S, C1 and C2 outputs.

The present invention may also be extended to an 8 × 8 multiplier with the same concepts applied by the use of an eight bit adder logic circuit. Such eight bit adder would have the truth table as illustrated in FIG. 6 which would be implemented in threshold logic as shown in FIG. 7. Since each threshold logic unit would require eight inputs the speed would be somewhat slower. With respect to the interconnection of the eight bit adders, conceptually the same design as utilized in FIG. 2 is used which includes the first level pseudo carry-look ahead, a carry save configuration and the use of a wired OR gate in the highest weight bit of the product.

I claim:

1. A binary multiplier logic circuit for multiplying two numbers each represented by a group of bits arranged in increasing order and in which a product is provided which is obtained by adding all of the partial products of the same weight the product consisting of several bits of increasing weights said multiplier comprising a first plurality of adder circuits having inputs and each having only a sum output for respectively providing different bits of said product, a second plurality of adder circuits staged in a carry save configuration and each having a sum output and at least one carry output said second plurality of adder circuits having as inputs at least two inputs selected from the group consisting of said partial products and said sums and carries, said inputs for each adder circuit all being of the same weight said sum outputs corresponding to such weight and said carry output to the next higher weight; and carry look ahead means for summing the inputs of each of said first plurality of adder circuits and respectively coupling said sum to an input of one of said second plurality of adder circuits which provides a sum output of the next higher weight relative to the respective sum output of the first adder circuit.

2. A multiplier as in claim 1 where said carry-look ahead means includes a wired AND connection of said inputs to provide said summing.

3. A multiplier as in claim 1 where said carry outputs of said second plurality of adder circuits having the same weight as the highest weight bit of said product are in a wired OR summing connection.

4. A multiplier as in claim 1 having at least a 4 × 4 capacity and where a majority of said second plurality of adder circuits have at least four inputs.

5. A multiplier as in claim 1 where a majority of said second plurality of adder circuits are of the threshold logic type.

6. A multiplier as in claim 5 where said adder circuits of the threshold logic type have a plurality of inputs and are responsive to a predetermined number of unit inputs to provide a predetermined logic output signal include: differential switch means responsive to said inputs for comparing each input to a reference and making a binary decision whether such input is higher or lower than said reference and for deriving complementary weighted currents in accordance with all of said binary decisions; level shifter means responsive to said complementary weighted currents for simultaneously producing a plurality of different threshold levels related to said weighted currents; and threshold detector means for comparing at least three of said levels to provide said logic output signal indicative of said predetermined number of unit inputs.

* * * * *